(12) United States Patent
Shen et al.

(10) Patent No.: US 11,886,370 B2
(45) Date of Patent: Jan. 30, 2024

(54) SHARING PACKAGE PINS IN A MULTI-CHIP MODULE (MCM)

(71) Applicants: ADVANCED MICRO DEVICES, INC., Santa Clara, CA (US); ATI TECHNOLOGIES ULC, Markham (CA)

(72) Inventors: Yulei Shen, Suzhou (CN); Tyrone Tung Huang, Markham (CA); Chen-Kuan Hong, Santa Clara, CA (US)

(73) Assignees: ADVANCED MICRO DEVICES, INC., Santa Clara, CA (US); ATI TECHNOLOGIES ULO, Markham (CA)

( * ) Notice: Subject to any disclaimer, the term of this patent is extended or adjusted under 35 U.S.C. 154(b) by 0 days.

(21) Appl. No.: 17/743,848

(22) Filed: May 13, 2022

(65) Prior Publication Data

US 2023/0367730 A1    Nov. 16, 2023

(51) Int. Cl.
| | | |
|---|---|---|
| G06F 13/40 | (2006.01) | |
| G06F 13/20 | (2006.01) | |
| H01L 25/065 | (2023.01) | |
| H01L 23/538 | (2006.01) | |
| H01L 23/00 | (2006.01) | |

(52) U.S. Cl.
CPC .......... *G06F 13/4031* (2013.01); *G06F 13/20* (2013.01); *H01L 23/5382* (2013.01); *H01L 25/0655* (2013.01); *H01L 23/5385* (2013.01); *H01L 23/5386* (2013.01); *H01L 24/16* (2013.01); *H01L 2224/16225* (2013.01); *H01L 2924/1431* (2013.01)

(58) Field of Classification Search
CPC . G06F 13/4031; G06F 13/20; H01L 23/5382; H01L 25/0655
See application file for complete search history.

(56) References Cited

U.S. PATENT DOCUMENTS

| | | | | |
|---|---|---|---|---|
| 6,101,457 | A  * | 8/2000 | Barch ............ | G01R 31/318555 |
| | | | | 324/73.1 |
| 6,496,880 | B1 * | 12/2002 | Ma ............................ | G06F 1/22 |
| | | | | 710/36 |
| 2005/0289428 | A1* | 12/2005 | Ong ................. | G01R 31/31905 |
| | | | | 714/742 |
| 2006/0132178 | A1* | 6/2006 | Volkening .......... | H03K 19/1732 |
| | | | | 326/81 |
| 2008/0304351 | A1* | 12/2008 | Lim ...................... | G06F 13/364 |
| | | | | 365/230.02 |
| 2015/0356039 | A1* | 12/2015 | Kris ......................... | G06F 1/22 |
| | | | | 710/104 |
| 2016/0267046 | A1* | 9/2016 | Kris ..................... | G06F 13/4282 |
| 2021/0124696 | A1* | 4/2021 | Aichriedler ......... | G06F 13/1668 |

* cited by examiner

*Primary Examiner* — Phong H Dang

(57) ABSTRACT

A semiconductor package includes multiple dies that share the same package pin. An output enable register provided on each die is used to select the die that drives an output to the shared pin. A hardware arbitration circuit ensures that two or more dies do not drive an output to the shared pin at the same time.

20 Claims, 8 Drawing Sheets

US 11,886,370 B2

SHARING PACKAGE PINS IN A MULTI-CHIP MODULE (MCM)

BACKGROUND

A typical example of a multi-chip module (MCM) is a semiconductor packaged integrated circuit that includes two or more semiconductor chips or dies mounted on a carrier substrate or interposer. For example, die pads of the two or more dies are electrically and mechanically coupled to contact pads on the die-side of the carrier substrate through die interconnects such as bumps or other solder structures. A typical carrier substrate includes an interconnect system that is made up of multiple layers of conductor pads and traces tied vertically by plural vias. The underside of the carrier substrate includes external contact pads, or package pins, that are electrically coupled to the die pads through this interconnect system and the die interconnects. The package pins can be electrically and mechanically coupled to a printed circuit board (PCB) or other carrier through package interconnects, which can be actual pins but can also be solder bumps, lands, leads, wires, and so on. Thus, the package pins are a gateway for the conveyance of power and ground to the packaged dies as well as for the conveyance of input/output (I/O') signals between the packaged dies and external components (e.g., a PCB).

In some cases, there is not a one-to-one correspondence between the number of I/O pads on the dies and the number of available I/O package pins. This can be due to design constraints of the package such as size, floorplan, and pin pitch limitations, but can also be due to advancements in die fabrication technology that allow for an ever-increasing density of die pads. Generally, the addition of package pins to supply dedicated I/O pathways results in an increase in the size and complexity of the package. In some cases, die I/O bumps are simply not connected to a package pin, or might be daisy chained to a primary die. In some cases, a package designer might sacrifice accessibility to certain functionality on the dies, such as testing and debug functionality that are not regularly utilized. However, data provided by such functionality is useful in discovering and correcting errors, and thus the observability of such data at the package or system level is desirable.

DETAILED DESCRIPTION

Figure 1:
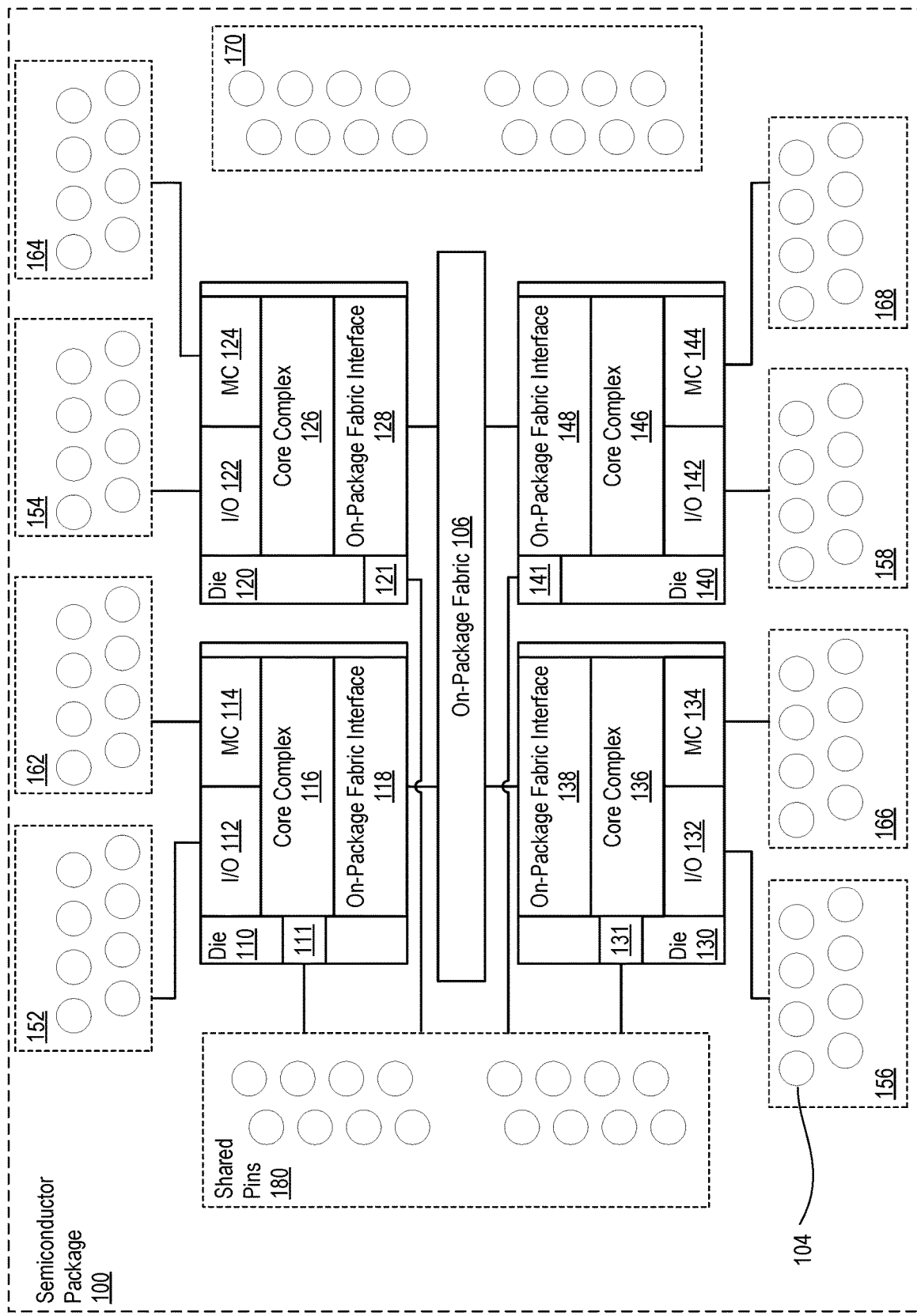
FIG. 1 sets forth a block diagram of an example of a multi-chip module semiconductor package for sharing package pins in a multi-chip module in accordance with some implementations of the present disclosure.

Implementations in accordance with the present disclosure are directed to sharing package pins by multiple dies in a multi-chip module (MCM). In various implementations, two or more dies are coupled to the same package pin. In some examples, a die does not drive an output to the shared package pin unless a register on that die has been set to enable output. For example, a program can write a value to the register of a die to enable output, such that the die is selected to drive an output to the shared package pin. In some examples, a hardware arbitration mechanism is provided in the package to ensure that no more than one die drives an output to the shared package pin at the same time. Thus, the number of die I/O pads that are accessible can be increased without increasing the number of package pins. Further, these shared package pins can be shared without contention for the shared package pins by multiple dies at the same time.

An Implementation of the present disclosure is directed to a semiconductor die for sharing package pins in a multi-chip module. The semiconductor die includes an output enable register. The die also includes logic configured to determine, based on at least a value in the output enable register, whether access to one or more shared package pins is granted to the die. The logic is further configured to assert control by the die over the one or more shared package pins in response to determining that access to the one or more shared package pins has been granted. In some examples, the die is disposed in a semiconductor package and the die shares access to the one or more shared package pins with two or more other dies in the semiconductor package. In some examples, the one or more shared package pins are coupled to testing logic or debug logic on the die.

In some implementations, determining, based on at least a value in the output enable register, whether access to one or more shared package pins is granted to the die includes driving an identifier of the die to arbitration circuitry and determining, based on an arbitration result of the arbitration circuitry, whether the die won arbitration. In some examples, the identifier of the die is driven to the arbitration circuitry in response to identifying that the value has transitioned from an inactive state value to an active state value. In some examples, the identifier of the die is driven to the arbitration circuitry in response to identifying a start bit broadcast by the arbitration circuitry. In some implementations, asserting, by the die in response to determining that access to the one or more shared package pins has been granted, control over the one or more shared package pins includes driving an output of the die to the one or more shared package pins when the die has won arbitration.

A variation of the Implementation is directed to a semiconductor package that includes two or more dies coupled to one or more shared package pins. Each die includes an output enable register and logic configured to determine, based on at least a value in the output enable register, whether access to one or more shared package pins is granted to the die. The logic is also configured to assert, by the die in response to determining that access to the one or more shared package pins has been granted, control over the one or more shared package pins.

In some implementations, the semiconductor package further includes arbitration circuitry. In these implementations, determining, based on at least a value in the output enable register, whether access to one or more shared package pins is granted includes driving an identifier of the die to the arbitration circuitry and determining, based on an arbitration result of the arbitration circuitry, whether the die won arbitration. In some examples, the identifier of the die is driven to the arbitration circuitry in response to identifying that the value has transitioned from an inactive state value to an active state value. In some examples, the identifier of the die is driven to the arbitration circuitry in response to identifying a start bit broadcast by the arbitration circuitry. In some implementations, asserting, by the die in response to determining that access to the one or more shared package pins has been granted, control over the one or more shared package pins includes driving an output of the die to the one or more shared package pins when the die has won arbitration.

In some examples, the logic is further configured to determine, when the arbitration result of the arbitration circuitry indicates that the die lost arbitration, that control over the one or more shared package pins cannot be asserted by the die. In some implementations, the logic is further configured to update, in response to determining that the die lost arbitration, the value in the output enable register.

In some examples, the arbitration circuitry includes at least one of an open-drain circuit and an open-collector circuit. In some examples, the one or more shared package pins are designed-for-test pins.

Another variation of the Implementation is directed to a method for sharing package pins in a multi-chip module. The method includes storing a first value in a first output enable register of a first die. The method also includes determining, based on at least the first value, whether access to one or more shared package pins is granted to the first die. The method further includes asserting, by the first die in response to determining that access to the one or more shared package pins has been granted, control over the one or more shared package pins. In some examples, the die is disposed in a semiconductor package and the die shares access to the one or more shared package pins with two or more other dies in the semiconductor package.

In some implementations, determining, based on at least the first value, whether access to one or more shared package pins is granted to the first die includes driving an identifier of the first die to arbitration circuitry and determining, based on an arbitration result of the arbitration circuitry, whether the first die won arbitration. In some examples, the identifier of the first die is driven to the arbitration circuitry in response to identifying that the first value has transitioned from an inactive state value to an active state value. In some examples, the first identifier of the first die is driven to the arbitration circuitry in response to identifying a start bit broadcast by the arbitration circuitry. In some implementations, asserting, by the first die in response to determining that access to the one or more shared package pins has been granted, control over the one or more shared package pins includes driving an output of the first die to the one or more shared package pins when the first die has won arbitration.

In some implementations, the method further includes storing a second value in a second output enable register of a second die and determining, based on the second value, that access to one or more shared package pins is granted to the second die. In these implementations, the method further includes driving an identifier of the second die to the arbitration circuitry and determining, based on the arbitration result of the arbitration circuitry, that control over the one or more shared package pins cannot be asserted. In some implementations, the method also includes updating, in response to determining that the second die lost arbitration, the second value in the second output enable register.

In some examples, the arbitration circuitry includes at least one of an open-drain circuit and an open-collector circuit. In some examples, the one or more shared package pins are designed-for-test pins.

Implementations in accordance with the present disclosure will be described in further detail beginning with FIG. 1. Like reference numerals refer to like elements throughout the specification and drawings. FIG. 1 sets forth a block diagram of an example multi-chip module (MCM) semiconductor package 100 in accordance with some implementations of the present disclosure. Implementations of the semiconductor package 100 can be useful in high performance applications, such as, for example, a personal computer, a notebook, a tablet, a smart phone, a storage data center, or applications involving large scale databases and/or analytics, such as finance, life sciences, and/or artificial intelligence. Many other applications are possible.

The example semiconductor package 100 of FIG. 1 includes multiple dies 110, 120, 130, 140. Although four dies are depicted in FIG. 1, it should be recognized that the semiconductor package 100 can include more or fewer dies. In the particular example of FIG. 1, the multiple dies are processor dies. However, it will be recognized that the dies 110, 120, 130, 140 of the semiconductor package 100 are not limited to processor dies. In some examples, each die 110, 120, 130, 140 includes a respective core complex 116, 126, 136, 146 that includes one or more processor cores as well as caches, cache management logic, buses and interface pathways, and other structures that can be shared by multiple processor cores in a core complex. Although only one core complex 116, 126, 136, 146 is depicted in each die 110, 120, 130, 140, each die can include multiple core complexes. In some examples, each die 110, 120, 130, 140 includes a respective on-package fabric interface 118, 128, 138, 148 to an on-package fabric 106, which provides data pathways for communication among the dies 110, 120, 130, 140 in the semiconductor package 100.

In some examples, each die 110, 120, 130, 140 includes a respective input/output ('I/O') controller 112, 122, 132, 142, which is a functional logic block that implements various protocols for providing a communication between the dies 110, 120, 130, 140 and components external to the semiconductor package 100. For example, the I/O controllers 112, 122, 132, 142 can provide an interface for peripheral component interconnect express ('PCIe') pathways, serial advanced technology attachment ('SATA') pathways, and so on. In some examples, each I/O controller 112, 122, 132, 142 is coupled to a respective package pin set 152, 154, 156, 158. The I/O package pin sets 152, 154, 156, 158 include package pins 104 that are dedicated for the die to which they are coupled for transferring data and instructions between the die and peripheral components.

In some examples, each die 110, 120, 130, 140 includes a respective memory controller 114, 124, 134, 144, which is a functional logic block that implements memory protocols for transferring data between the dies 110, 120, 130, 140 and a memory device through the dispatch of read and write commands. For example, the memory controller 114, 124, 134, 144 can provide an interface for double data rate ('DDR') pathways to a memory device (not shown). In some examples, each memory controller 114, 124, 134, 144 is coupled to a respective package pin set 162, 164, 166, 168. The memory package pin sets 162, 164, 166, 168 include package pins 104 that are dedicated for the die to which they are coupled for the purpose of interfacing with memory devices.

In some examples, each die 110, 120, 130, 140 includes a respective logic block 111, 121, 131, 141 that is not coupled to a dedicated package pin set. For example, the logic blocks 111, 121, 131, 141 can be designed-for-testing ('DFT') logic blocks, debugging logic blocks, and so on. As mentioned earlier, the dies 110, 120, 130, 140 often include more die I/O pads than the available package pins. To accommodate logic blocks 111, 121, 131, 141 that might be used infrequently, and are thus not allocated dedicated package pins, the semiconductor package 100 includes a shared package pin set 180 composed of package pins 104 that are each shared by two or more of the dies 110, 120, 130, 140 in the package. In the particular example of FIG. 1, logic blocks 111, 121, 131, 141 are coupled to the shared package pin set 180. However, it should be recognized that any logic block within the multiple dies 110, 120, 130, 140 can be coupled to the shared package pin set 180.

In some examples, the semiconductor package 100 also includes additional package pins 170. In one example, these package pins can be dedicated as socket extension interconnects, for example, to connect the semiconductor package 100 to another package or to a high-speed component. In other examples, the package pins 170 can be utilized for I/O or memory communication. The pathways between the dies 110, 120, 130, 140 and the package pin set 170 are omitted for clarity.

Figure 2:
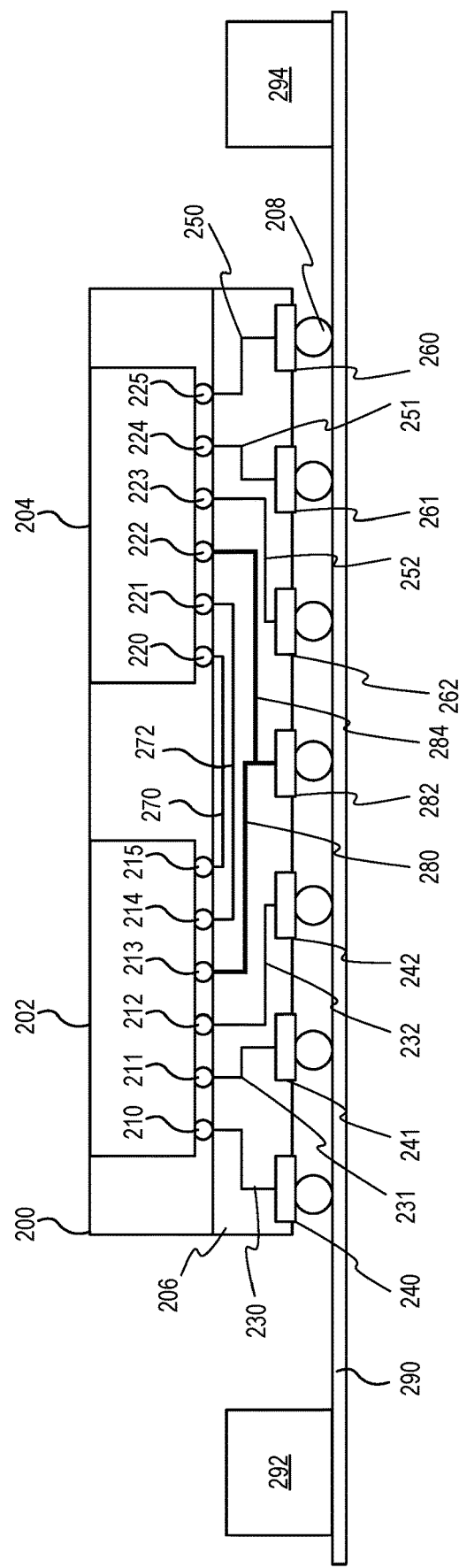
FIG. 2 sets forth a sectional view of another example multi-chip module semiconductor package for sharing package pins in a multi-chip module in accordance with some implementations of the present disclosure.

For further explanation, FIG. 2 sets forth a sectional view of an example system for sharing package pins in a multi-chip module in accordance with some implementations of the present disclosure. FIG. 2 includes a semiconductor package 200, which can be similar to the semiconductor package 100 described above with reference to FIG. 1. As discussed above, the semiconductor package 200 includes a shared package pin among other dedicated package pins, as will be explained in detail below. The example system depicted in FIG. 2 is provided for explanation only, and it will be recognized that the numerical scale of various components such as dies, pads, interconnects, bumps, and so on, of the semiconductor package 200 will be much greater than what is depicted in this example of FIG. 2. While a single shared package pin is discussed with reference to FIG. 2, it will be recognized that the semiconductor package 200 can include multiple shared package pins.

As depicted in the example, the semiconductor package 200 includes a first die 202 and a second die 204 coupled to a package substrate 206. It should be recognized that more dies can be included in the package 200, and that some components are not visible within a sectional view. In some examples, the first die 202 is coupled to the substrate 206 via conductive bumps 210-215 (e.g., micro-bumps or other solder structures). In some examples, the conductive bumps 210-215 are coupled to conductive pads (not shown) on an interface surface of the first die 202, which are in turn connected, via redistribution layers, to various functional blocks of the first die 202 such as I/O controllers, memory controllers, and so on. Similarly, in some examples, the second die 204 is coupled to the substrate 206 via conductive bumps 220-225 (e.g., micro-bumps or other solder structures). In some examples, the conductive bumps 220-225 are coupled to conductive pads (not shown) on an interface surface of the second die 204, which are in turn connected, via redistribution layers, to various functional blocks of the second die 202 such as I/O controllers, memory controllers, and so on.

In some examples, the substrate 206 includes various package pads 240, 241, 242, 260, 261, 262, 282, generally referred to as package pins, that are external contact pads electrically coupled to the various conductive bumps 210-215 and 220-225 through substrate routing layers. The package pads 240, 241, 242, 260, 261, 262, 282 can be, for example, contact pads coupled to pins of a pin grid array, to lands of a land grid array (LGA), or to solder balls of a ball grid array (BGA), or to other conductive interconnect structures that serve as package interconnects for the semiconductor package 200. In the example of FIG. 2, the package pads are electrically coupled, through interconnect structures 208, to a card 290 such as a printed circuit board (PCB), interposer, or additional substrate. In some implementations, other components 292, 294 are also coupled to the card 290, which provides electrical routing for communication between package components (e.g., dies 202, 204) and the other components 292, 294. In various examples, the other components can be memory devices (e.g., high bandwidth memory (HBM)), firmware components, communication components (e.g., a network interface card (NIC) socket, a universal serial bus (USB) socket) for communication with external devices, and so on.

In the particular example depicted in FIG. 2, which is provided for example and not limitation, an I/O bump 210 of the first die 202 is electrically connected to pad 240 through substrate routing 230; I/O bump 211 is electrically connected to pad 241 through substrate routing 231; and I/O bump 212 is electrically connected to pad 242 through substrate routing 232. The pads 240, 241, 242 are dedicated package interconnects (e.g., package pins) for the first die 202. Further, an I/O bump 223 of the second die 204 is electrically connected to pad 262 through substrate routing 252; I/O bump 224 is electrically connected to pad 261 through substrate routing 251; and I/O bump 225 is electrically connected to pad 260 through substrate routing 250. The pads 260, 261, 262 are dedicated package interconnects (e.g., package pins) for the second die 202. In this example, the first die 202 also includes bumps 214, 215 that are electrically coupled to bumps 220, 221 of the second die 204 through on-package fabric routing 270, 272 in the substrate routing layer for die-to-die communication.

As explained above, in some examples the first die 202 and the second die 204 share a package pin or package interconnect such as package pad 282. In the particular example of FIG. 2, a bump 213 of the first die 202 is electrically coupled to the package pad 282 through substrate routing 280. Similarly, a bump 222 of the second die 204 is electrically coupled to the package pad 282 through substrate routing 284. In some implementations, one or more of the components 292, 294 is a memory device or firmware component that includes executable instructions for a program that utilizes the shared package pad 282 to communicate with the first die 202 and the second die 204 individually. For example, the program can be a testing program, and the bumps 213, 222 of the dies, 202, 204 can be test output ports for providing data to the testing program.

Figure 3:
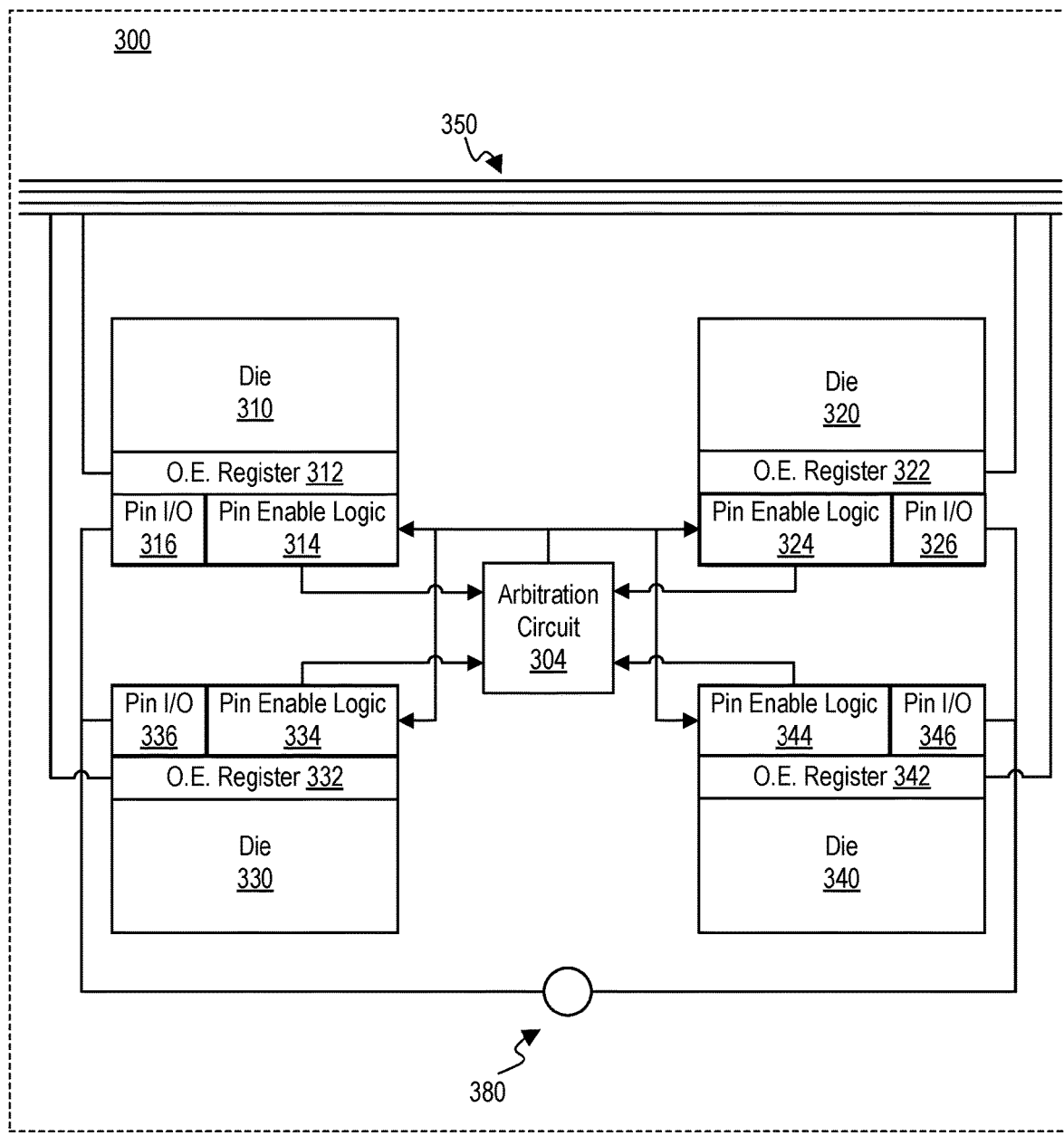
FIG. 3 sets forth a block diagram of another example of a multi-chip module semiconductor package for sharing package pins in a multi-chip module in accordance with some implementations of the present disclosure.

For further explanation, FIG. 3 sets forth another example semiconductor package 300 for sharing package pins in a multi-chip module in accordance with some implementations of the present disclosure. The example semiconductor package 300 can be similar to the example semiconductor package 100 in FIG. 1 or the example semiconductor package 200 in FIG. 2. In the example of FIG. 3, the semiconductor includes multiple dies 310, 320, 330, 340. Although four dies are depicted in FIG. 3, it should be recognized that the package 300 can include more or fewer dies. In some implementations, each die 310, 320, 330, 340 includes respective pin enable logic 314, 324, 334, 344 that determines whether it has control over a shared package pin 380 or set of pins. When a particular die has control over the shared package pin 380, it can drive an output (e.g., test data, debug data, etc.) on the shared package pin 380. A die does not drive an output on the shared package pin 380 unless it has determined that it has control over the shared package pin 380. In some examples, each die 310, 320, 330, 340 includes an output enable register 312, 322, 332, 342 that stores a value indicating that it has been granted access to the shared package pin 380. For example, the output enable register can store a value indicating that the die is in an active state or an inactive state. In the active state, output to the shared package pin 380 is enabled for the die and thus the die can drive its output to the shared package pin 380. In the inactive state, output to the shared package pin 380 is disabled and thus the die should not drive its output to the shared package pin 380. In some implementations, when a program (e.g., a test program) intends to read the output of a particular die from the shared package pin, the program writes a value indicating the active state into the output enable register of that die over the input lines 350, which may be general purpose data lines that utilize existing dedicated pins. Thus, the program can select a die to output to the shared package pin 380 without a dedicated pin for activating the die. In some examples, the program writes a value for the inactive state to the output enable registers 312, 322, 332, 342 of all dies 310, 320, 330, 340 before writing the value for the active state to the output enable register of a selected die. In this way, the program resets the output enable registers 312, 322, 332, 342 before selecting a die. In some examples, each die 310, 320, 330, 340 includes pin I/O control logic 316, 326, 336, 346 for the shared package pin 380. In some implementations, when the enable logic of a die determines that output is enabled for the die based on the value in the output enable register, the pin I/O control logic drives an output of the die to the shared package pin 380.

In some implementations, an arbitration circuit 304 is employed by the semiconductor package 300 to resolve contention for the shared package pin 380 by two or more dies. In some cases, there may be an error in resetting the values in the output enable registers 312, 322, 332, 342 such that two or more output enable registers store a value for the active state at the same or nearly the same time. To resolve contention in such examples, the enable logic 314, 324, 334, 344 determines that output to the shared package pin 380 is enabled for the die only if its output enable register indicates an active state and the arbitration circuit 304 indicates that the die has won arbitration. In some implementations, each die 310, 320, 330, 340 is configured with a die identifier and the enable logic drives the die identifier to the arbitration circuit when its output enable register 312, 322, 332, 342 stores a value for the active state. The arbitration circuit 304 broadcasts the die identifier of the die that wins arbitration. The die that wins arbitration can drive its output to the shared package pin 380, while any loser of the arbitration resets its output enable register to the inactive state.

In some implementations, the arbitration circuit 304 broadcasts a start bit to initiate arbitration. Upon encountering the start bit, the enable logic 314, 324, 334, 344 of each die 310, 320, 330, 340 that stores a value for the active state in its output enable register 312, 322, 332, 342 drives its die identifier to the arbitration circuit 304. For example, the enable logic of each die drives its die identifier serially, such that the arbitration circuit 304 receives one bit of a die identifier from each die that is driving its die identifier before receiving the next bit of the die identifiers. The arbitration circuit 304 broadcasts the result of the bit-wise comparison of the die identifiers to all dies 310, 320, 330, 340. The enable logic 314, 324, 334, 344 of each die compares the result bit received from the arbitration circuit 304 to its die identifier to determine whether it has lost the first round of arbitration. When the enable logic determines that the bit received from the arbitration circuit does not match the corresponding bit of its die identifier, the enable logic discontinues driving its die identifier to the arbitration circuit 304 and updates its output enable register with the value for the inactive state. When the enable logic of a die determines that the complete set of result bits broadcasted by the arbitration circuit 304 matches its die identifier, that die has won arbitration and thus controls the output enable pin. In some examples, when enable logic 314, 324, 334, 344 of a die 310, 320, 330, 340 identifies that the value in the output enable register 312, 322, 332, 342 transitions from the inactive state to the active state, the enable logic drives the start bit to the arbitration circuit 304, which broadcasts the start bit to all dies 310, 320, 330, 340. Thus, the enable logic can initiate arbitration when its output enable transitions to the active state.

Consider an example where die 310 has a die identifier '00'; die 320 has a die identifier '01'; die 330 has a die identifier '10'; and die 340 has a die identifier 'H.' A program that intends to read the output of die 320 from the shared package pin 380 writes a value for the active state to the output enable register 322 of die 320. However, in this example, the output enable register 332 of die 330 also stores a value indicating the active state. This can be due to, for example, an error in resetting the output enable registers 312, 322, 332, 342 prior to selecting die 320, or an error where two different programs or threads writing the active state value to different dies. Because the enable logic 324, 334 of both dies 320, 330 observes the active state in their output enable registers 322, 332, the enable logic 324, 334 of each die determines that it has been granted access to drive the shared package pin, and will therefore participate in arbitration. Thus, upon seeing the start bit (e.g., '0') from the arbitration circuit 304, the enable logic 324, 334 of each die 320, 330 drives the first bit of its die identifier to the arbitration circuit 304. In this case, die 320 drives a '0' to the arbitration circuit 304 and die 330 drives a '1' to the arbitration circuit 304. The result broadcast by the arbitration circuit is '0'— that is, the Boolean AND of '0' and '1.' Upon seeing the '0' broadcast by the arbitration circuit, the enable logic 334 of die 330 determines that it has lost arbitration because the result '0' broadcast by the arbitration circuit is different than the die identifier bit '1' that the enable logic 334 drove to the arbitration circuit 304. Accordingly, the enable logic 334 of die 330 discontinues arbitration by not driving and further die identifier bits to the arbitration circuit, and updates its output enable register 332 to indicate a value for the inactive state. Conversely, upon seeing the '0' broadcast by the arbitration circuit, the enable logic 324 of die 320 determines that it can continue arbitration because the result '0' broadcast by the arbitration circuit 304 is the same as the die identifier bit '0' that the enable logic 324 drove to the arbitration circuit 304. The enable logic 324 then drives the second bit '1' of its die identifier to the arbitration circuit 304. Because die 330 has discontinued arbitration, the result broadcast by the arbitration circuit is necessarily '1.' Upon determining that the arbitration circuit has broadcast a die identifier '01' that matches the die identifier '01' of die 320, the enable logic 324 of die 320 determines that is won arbitration and has control over the shared package pin 380, such that the I/O controller 326 can safely drive an output of die 320 to the shared package pin 380.

With continued reference to the above example, it may be the case that the die that wins arbitration is not the die selected by the program. For example, in a modification of the above example, assume that the program selects die 330 by writing the value for the active state to the output enable register 332. In this instance, die 320 and die 330 both store a value for the active state in their output enable registers 322, 322. However, as can be seen above, die 320 will win arbitration and will drive its output to the shared package pin 380. Accordingly, the enable logic 334 of die 330 will transition its output enable register 332 from the active state to the inactive state. When the program reads the result from the shared package pin 380, it can also read the values stored in the output enable registers 312, 322, 332, 342 of each die 310, 320, 330, 340. Based on the values stored in the output enable registers, the program can determine that it has read the output of die 320 from the shared package pin instead of the output from die 330, which was selected by the program. That is, the value in the output enable register 322 of die 320 will indicate the active state, and thus the program can determine that it has read the output of die 320 from the shared package pin 380.

Figure 4:
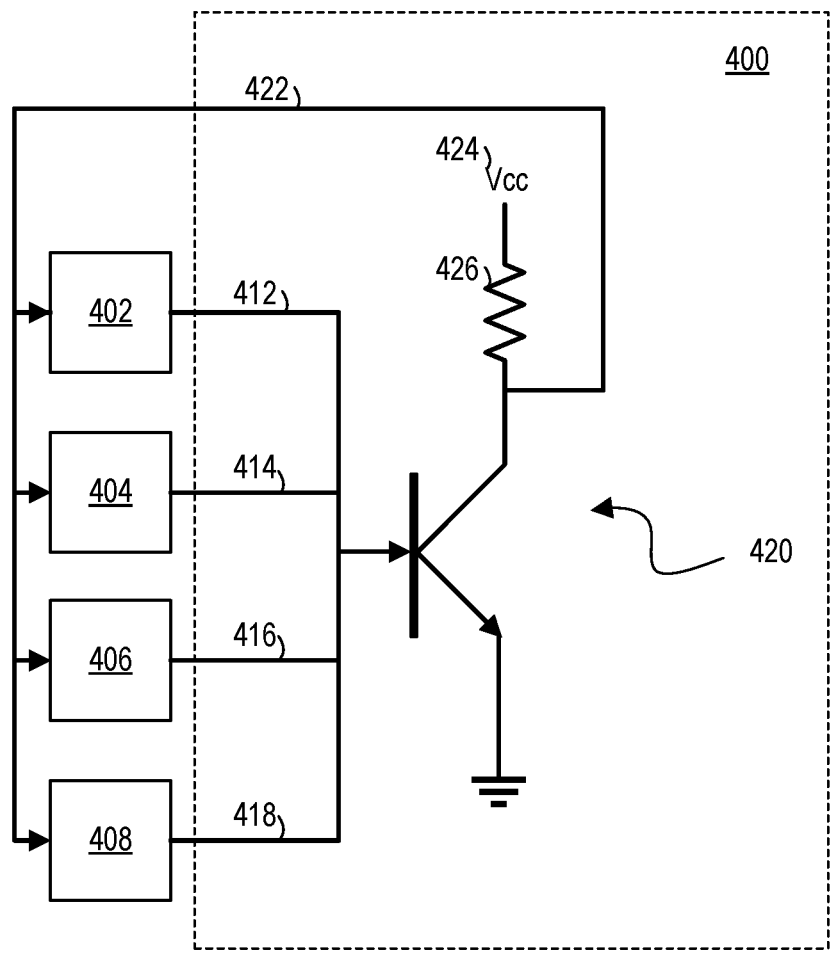
FIG. 4 sets forth an example hardware arbitration circuit for sharing package pins in a multi-chip module in accordance with some implementations of the present disclosure.

For further explanation, FIG. 4 sets forth a diagram of an example arbitration circuit 400 in accordance with some implementations of the present disclosure. In some implementations, the arbitration circuit 400 utilizes open-drain circuitry to arbitrate among die identifiers of multiple dies 402, 404, 406, 408. In some examples, the arbitration circuit 400 includes input pathways 412, 414, 416, 418 from multiple dies 402, 404, 406, 408 connected to a gate of a transistor 420. The source of the transistor 420 is connected to ground and the drain is connected to an output pathway 422. A voltage source 424 and a pull-up resistor 426 are also connected to the drain of the transistor to maintain the logical output of the circuit at logical '1' when the transistor is tri-stated. When a voltage is applied to the transistor 420 to turn it on, the current sinks to ground, resulting in a logical '0' being driven on the output pathway 422. When the transistor 420 is tri-stated by all dies, the pull-up resistor maintains a logical '1' on the output pathway 422. Thus, when participating in arbitration, a die drives its die identifier to the arbitration circuit by either supplying a voltage to turn on the transistor to effect a logical '0' on the output pathway 422, or by maintaining high impedance state to effect a logical '1' on the output pathway 422. Thus, any die that turns on the transistor 420 will drive the output pathway 422 to logical '0'.

The output pathway 422 is fed back to all dies 402, 404, 406, 408. A die that is participating in arbitration will sample the output pathway 422 to determine whether the die identifier bits broadcast by the arbitration circuit 400 matches its die identifier. To initiate arbitration when the value in the output enable register transitions to active, a die drives a voltage that turns the transistor 420 on, thus effecting a '0' on the output pathway to provide a start bit. Upon seeing the start bit on the output pathway 422 of the arbitration circuit 400, each die 402, 404, 406, 408 that has its output enable register set to active will drive the first bit of its die identifier on its respective input pathway 412, 414, 416, 418, and samples the result bit on the output pathway. For example, a die with a die identifier '01' will drive a first bit '0' by supplying a voltage to turn on the transistor 420, and a die with an die identifier '10' will drive a first bit '1' by maintaining a high impedance state. In this case, the result bit is '0' due to the open-drain circuit. It will be recognized that the circuitry of FIG. 4 can also be implemented as an open-collector circuit.

Figure 5:
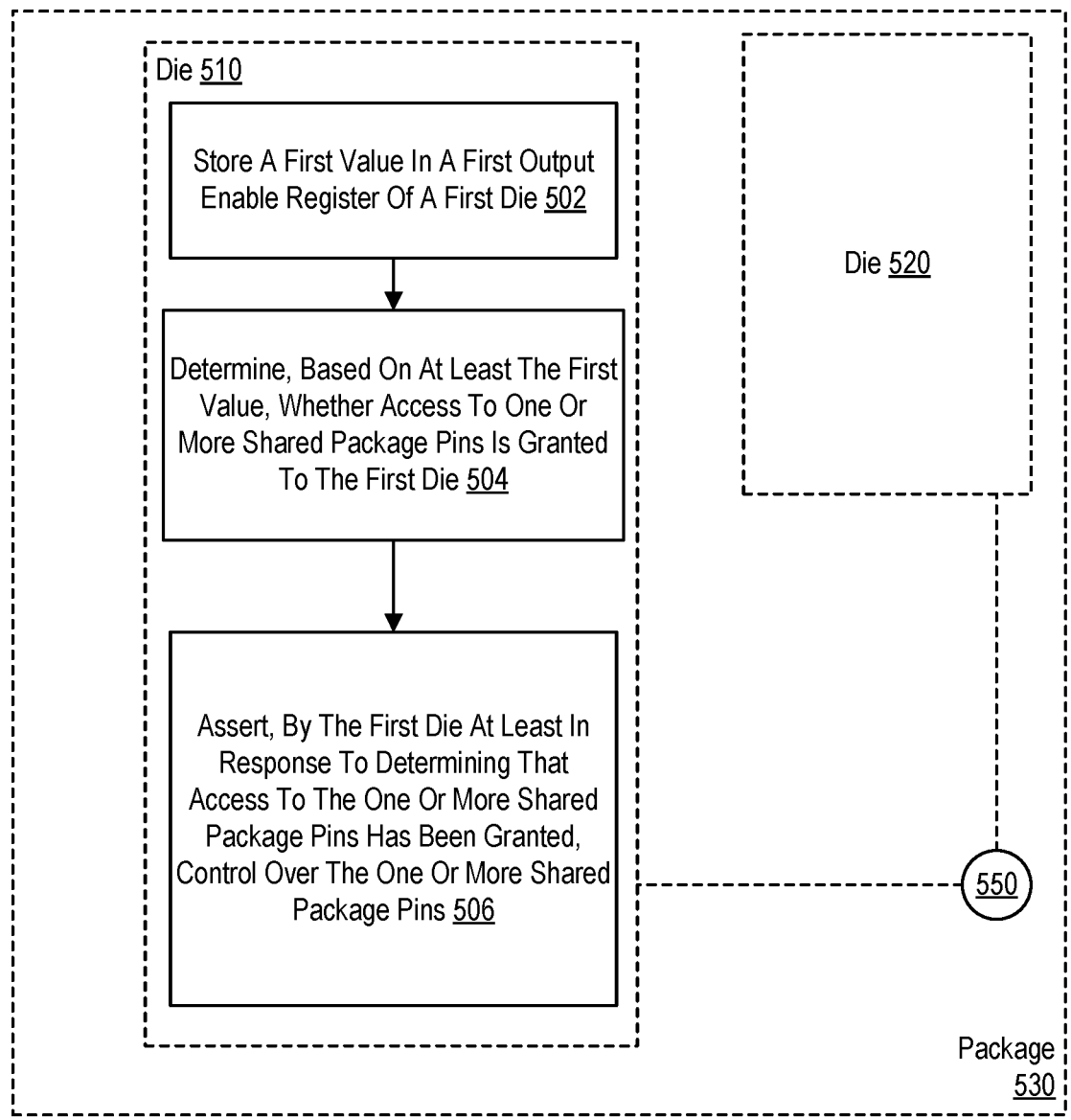
FIG. 5 is a flowchart of an example method of sharing package pins in a multi-chip module in accordance with some implementations of the present disclosure.

For further explanation, FIG. 5 sets forth a flow chart illustrating an example method of sharing package pins in a multi-chip module in accordance with some implementations of the present disclosure. The example of FIG. 5 includes at least a first die 510 and a second die 520 in a semiconductor package 530. Although only two dies are depicted in the example of FIG. 5, it will be appreciated that the package 530 can include more than two dies. The first die 510 and the second die 520 can be similar to any of the dies discussed above with reference to FIGS. 1-4 or combinations thereof. The first die and the second die 520 share one or more package pins 550, where the one or more package pins 550 convey input/output signals into and out of the package. Here, although the term "pin" is used, it will be recognized that a "pin" can refer to pads, solder bumps, lands, contacts, leads, wires, or other conductive structures that are provided on a package for conveying input/output signals. The example of FIG. 5 also includes an arbitration circuitry 540, which can be similar to any of the arbitration circuitry discussed above with reference to FIGS. 3-4 or combinations thereof.

The example method of FIG. 5 includes storing 502 a first value in a first output enable register of a first die 510. The value stored in the output enable register indicates whether the die 510 is enabled to output data on the one or more shared package pins 550. In some examples, the value can indicate either an 'active' state or an 'inactive' state. In the active state, the die 510 can drive data to the one or more shared package pins 550, whereas in the inactive state the die 510 should not drive any data to the one or more shared package pins 550. For example, the active state can be represented by a value of '1' and the inactive state can be represented by a value of '0.' In some examples, a program writes the value to the output enable register of the first die 510. When an output of the first die 510 should be driven to the one or more shared package pins 550, the program writes a value indicating the active state to the output enable register. When an output of another die in the package should be driven to the one or more shared package pins 550, the program writes a value indicating the inactive state to the output enable register of the die 510. In some examples, the program will write a value indicating the inactive state to all dies 510, 520 in the package 530 before writing a value indicating the active state to the selected die.

The example method of FIG. 5 also includes determining 504 whether access to one or more shared package pins 550 is granted to the first die 510 based on at least the first value. In some examples, pin enable logic in the first die 510 identifies the value stored in the output enable register and determines whether the value indicates the active state or the inactive state for output to the one or more shared package pins 550. If the value indicates the active state, the pin enable logic ascertains that access to the one or more shared package pins 550 has been granted to the die 510, and thus output to the one or more shared package pins 550 is enabled. If the value indicates the inactive state, the pin enable logic ascertains that access to the one or more shared package pins 550 has not been granted to the die 510, and thus output to the one or more shared package pins 550 is not enabled.

The example method of FIG. 5 also includes asserting 506 by the first die 510 control over the shared package pins 550 in response to determining that access to the shared package pins 550 has been granted. In some examples, when the enable logic in the first die 510 determines that access has been granted to the first die, the die 510 asserts control over the one or more shared package pins 550 by driving an output to the one or more shared package pins 550. In other examples, the die 510 asserts control of the shared package pins by signaling that the die is enabled to output data to the one or more shared package pins.

Figure 6:
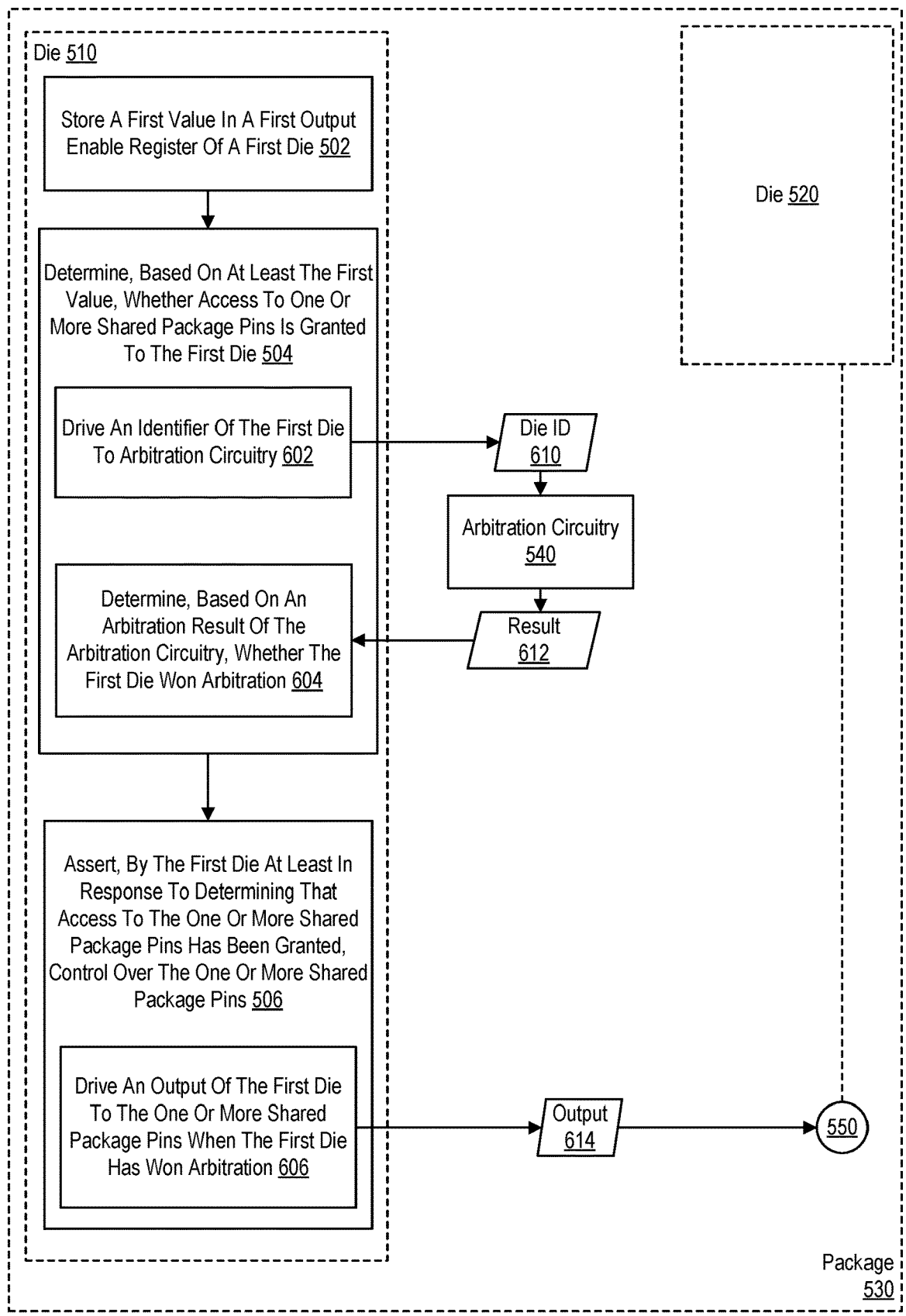
FIG. 6 is a flowchart of another example method of sharing package pins in a multi-chip module in accordance with some implementations of the present disclosure.

For further explanation, FIG. 6 sets forth a flow chart illustrating an extension of the example method of FIG. 5. In the example of FIG. 6, determining 504 whether access is granted to the first die 510 includes driving 602 an identifier 610 of the first die 510 to arbitration circuitry 540. Upon identifying that the value in the output enable register has changed from an inactive state value to the active state value, enable logic in the die 510 drives a die identifier 610 to the arbitration circuitry 540. Upon identifying a start bit broadcast by the arbitration circuitry and identifying that the value in the output enable register indicates the active state, enable logic in the die 510 drives the die identifier 610 to the arbitration circuitry 540. The enable logic drives each bit of the die identifier serially while sampling the output of the arbitration circuitry.

In the example of FIG. 6, determining 504 whether access is granted also includes determining 604 whether the first die 510 won arbitration based on an arbitration result 612 of the arbitration circuitry 540. If the arbitration circuitry 540 broadcasts an arbitration result that identifies the die identifier 610 of the die 510, the enable logic of the die 510 determines that the die 510 has won arbitration. Upon driving the first bit of the die identifier 610 to the arbitration circuitry 540, the enable logic of the die 510 samples the output of the arbitration circuitry 540 to ascertain the arbitration result 612. If the bit in the arbitration result 612 matches the bit of the die identifier 610 that was driven to the arbitration circuitry 540, the die 510 passes the first round of arbitration. If there are additional bits to in the die identifier 610, the enable logic drives the next bit of the die identifier 610 to the arbitration circuitry 540 and samples the output of the arbitration circuitry 540 to ascertain the arbitration result 612. When the enable logic of the die 510 observes the full die identifier 610 of the die 510 in the arbitration result, the die has won arbitration. If the enable logic of the die 510 observes at any point that the bit in the arbitration result does not match the bit of the die identifier 610 that was driven to the arbitration circuitry 540, the enable logic determines that the die has lost arbitration.

The arbitration circuitry 540 acts as a failsafe in the event that two or more dies have a value in their output enable registers that indicates the active state. To prevent two or more dies from accidentally attempting to drive the one or more shared package pins 550 at the same time, any die that has its output enable register set to the active state value automatically participates in arbitration by driving its die identifier to the arbitration circuitry 540. It should be recognized that in many cases only one die will participate in arbitration. That is, if all output enable registers are correctly reset before a die is selected for output to the shared package pins 550, only one die will drive its die identifier to the arbitration circuitry 540. Without contention from other dies, the die that drives its die identifier to the arbitration circuitry 540 will necessarily win arbitration.

In the example of FIG. 6, asserting 506 control over the shared package pins 550 includes driving 606 an output 614 of the first die 510 to the shared package pins 550 when the first die 510 has won arbitration. The enable logic of the first die 510 determines that it won arbitration based on the arbitration result 612 broadcasted by the arbitration circuitry. Thus, when the output enable register indicates a value for the active state and the die wins arbitration, the die 510 then asserts control of the one or more shared package pins 550 by driving its output 614 to the one or more shared package pins 550. For example, the output 614 can be test result data or debug data, such as data relating various processing states, register states, or memory states of the die 510. If the die 510 loses arbitration, it does not assert control of the one or more shared package pins 550. If the die 510 lose arbitration, the enable logic updates the output enable register with a value indicating the inactive state.

Figure 7:
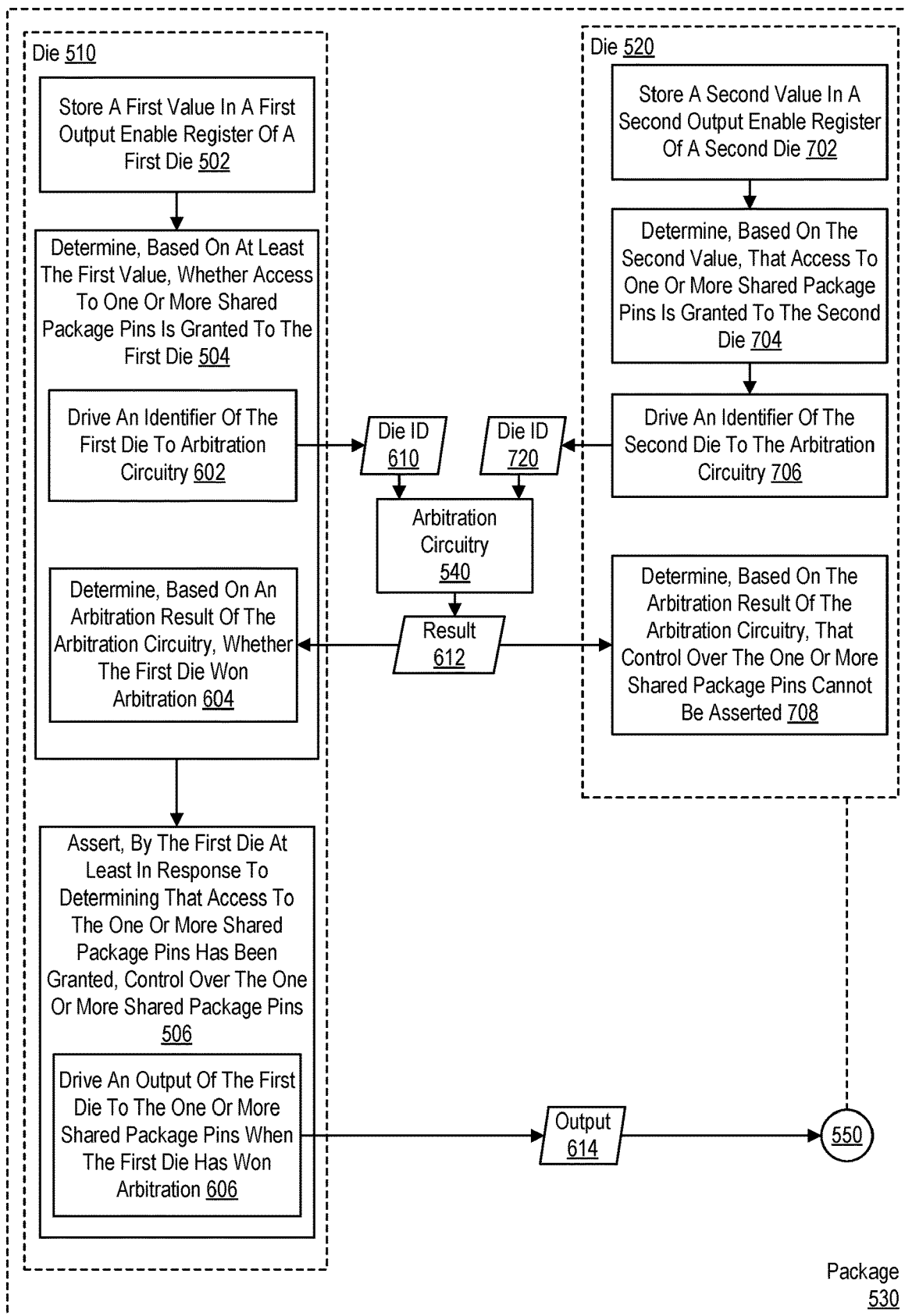
FIG. 7 is a flowchart of another example method of sharing package pins in a multi-chip module in accordance with some implementations of the present disclosure.

For further explanation, FIG. 7 sets forth a flow chart illustrating an example addition to the method of FIG. 6. The example of FIG. 7 includes storing 702 a second value in a second output enable register of a second die 520. In some examples, a program resets the output enable registers by writing the inactive state value to all dies 510, 520 in the package 530 before writing the active state value to the die 510 selected to drive the output of the die 510 to the one or more shared package pins 550. However, in some cases there can be an error where the program does not reset the output enable registers or where a different program or thread writes the active state value to a different die 520. In these cases, two dies 510, 520 both have their output enable registers set to the active state. Thus, storing 702 the second value in the second output enable register can include storing the active state value in the output enable register of the second die 520 at the same time that the active state value is stored in the output enable register of the first die 510. In one example, the active state value stored in the output enable register of second die 520 can be held over, due to an error in resetting the output enable register, from a previous selection of the second die 520 to drive the shared package pins 550. In another example, the active state value stored in the output enable register of second die 520 is written by a different program or thread than the program or thread that wrote the active state value to the output enable register of the first die 510.

The example method of FIG. 7 also includes determining 704, based on the second value, that access to one or more shared package pins 550 is granted to the second die 520. As previously discussed, enable logic of the second die 520 identifies the value in the output enable register of the second die 520 and determines whether the value is an active state value or an inactive state value. When the value is the active state value, the enable logic determines that access to the one or more shared package pins 550 is granted to the second die 520.

The example method of FIG. 7 also includes driving 706 an identifier 720 of the second die 520 to the arbitration circuitry 540. In some examples, the enable logic of the second die 520 drives its die identifier to the arbitration circuitry 540 in response to identifying a start bit broadcasted by the arbitration circuitry and determining that the active state value is stored in the output enable register of the second die 520. In some implementations, the enable logic of the second die 520 drives its die identifier 720 in the same manner as described above. That is, the enable logic of the second die 520 drives the first bit of the die identifier 720 to the arbitration circuitry 540 and then samples the result bit in the arbitration result 612 broadcast by the arbitration circuitry 540.

The example method of FIG. 7 also includes determining 708, based on the arbitration result 612 of the arbitration circuitry 540, that control over the one or more shared package pins 550 cannot be asserted. In some examples, the enable logic of the second die 520 compares the result bit of the arbitration result 612 to the die identifier bit that was driven by the second die 520. When the result bit does not match the die identifier bit that was driven by the second die 520, the enable logic of the second die 520 determines that the die 520 has lost arbitration and therefore control over the shared package pins 550 cannot be asserted. In other words, die 520 should not drive its output to the shared package pin because, in this particular example, die 510 has won arbitration and will be driving its output 614 to the one or more shared package pins 550.

Consider an example where die 510 has a die identifier '00' and die 520 has a die identifier '10.' When die 510 drives a '0' as the first bit of it die identifier 610 to the arbitration circuitry 540 and die 520 drives a '1' as the first bit of its die identifier 720 to the arbitration circuitry 540, a result bit '0' is broadcasted by the arbitration circuitry 540. The enable logic of die 520 compares the result bit '0' to the die identifier bit '1' and determines that die 520 has lost arbitration. The enable logic of the second die 520 then discontinues participation in the arbitration by not driving the second bit of its die identifier 720. This allows the second bit of the die identifier 610 of the first die to determine the winner of the arbitration.

Consider another example where die 510 has a die identifier '00' and die 520 has a die identifier '01.' When die 510 drives a '0' as the first bit of it die identifier 610 to the arbitration circuitry 540 and die 520 drives a '0' as the first bit of its die identifier 720 to the arbitration circuitry 540, a result bit '0' is broadcast by the arbitration circuitry 540. The enable logic of die 520 compares the result bit '0' to the die identifier bit '0' and determines that die 520 can continue arbitration. Die 510 then drives a '0' as the second bit of it die identifier 610 to the arbitration circuitry 540 and die 520 drives a '1' as the second bit of its die identifier 720 to the arbitration circuitry 540, a result bit '0' is broadcast by the arbitration circuitry 540. The enable logic of the second die 520 then determines that it has lost arbitration because the die identifier '00' in the arbitration result does not match the die identifier 720 of the second die.

Figure 8:
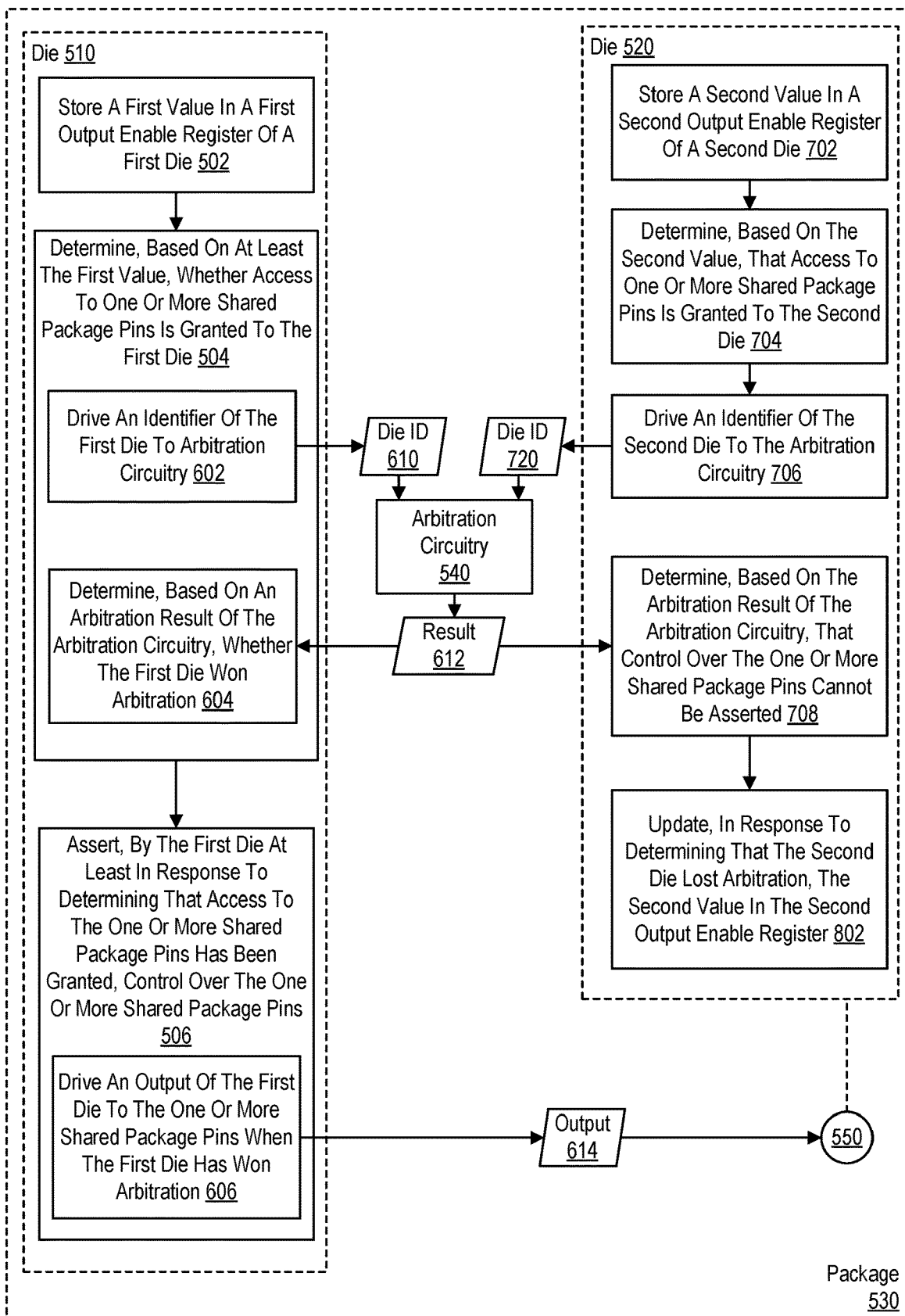
FIG. 8 is a flowchart of another example method of sharing package pins in a multi-chip module in accordance with some implementations of the present disclosure.

For further explanation, FIG. 8 sets forth a flow chart illustrating an example addition to the method of FIG. 7. The example of FIG. 8 includes updating 802, in response to determining that the second die 520 lost arbitration, the second value in the second output enable register. In some implementations, when the enable logic of the second die 520 determines that the second die 520 has lost arbitration, the enable logic of the second die 520 overwrites the active state value in the output enable register with the inactive state value. Thus, when the die 520 loses arbitration on the first bit of the die identifier 720, as explained in one example above, the enable logic writes the inactive state value to the output enable register. Accordingly, the die 520 does not participate in further arbitration on additional bits of the die identifier 720. When a program reads the output of the one or more shared package pins 550, the program can also read the output enable registers of all dies 510, 520 in the package to determine which die won arbitration and supplied the output of the one or more shared package pins 550. In one example, if the program had selected die 520 to drive its output to the shared package pins 550, upon sampling the values in the output enable register the program can ascertain that it was die 510 that drove its output to the shared package pins 550. The program can then retry the operation by resetting all of the output enable registers and writing the active state value to the output enable register of the second die 520.

In view of the foregoing description, implementations in accordance with the present disclosure provide a number of advantages. Multiple dies in a package can share a package pin to provide package level and system level observability of data in a die without increasing the package pin count (i.e., by adding a dedicated package pin to access the data in each die individually). A die can be selected to drive its output to the shared package pin via a software interface that writes an enable output value to a register of the selected die. The hardware arbitration ensures that, in the face of an error, two or more dies will not attempt to drive output to the shared package pins at the same time. Thus, the above-described implementations provide a low-cost mechanism for accessing I/O's of a die that would have otherwise not been available without increasing the package pin count.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A semiconductor die comprising:
an output enable register; and
logic configured to:
drive a die identifier to arbitration circuitry based on determining that a value in the output enable register indicates that access to one or more shared package pins is granted to the die, wherein each bit of the die identifier is driven serially;
assert, by the die, control over the one or more shared package pins in response to determining that the die has won arbitration based on each result bit broadcast by the arbitration circuitry in response to each bit of the die identifier.

2. The semiconductor die of claim 1, wherein asserting control over the one or more shared package pins includes driving an output of the die to the one or more shared package pins when the die has won arbitration.

3. The semiconductor die of claim 2, wherein the identifier of the die is driven in response to at least one of:
identifying that the value has transitioned from an inactive state value to an active state value; and
identifying a start bit broadcast by the arbitration circuitry.

4. The semiconductor die of claim 1, wherein the die is disposed in a semiconductor package and the die shares access to the one or more shared package pins with two or more other dies in the semiconductor package.

5. The semiconductor die of claim 1, wherein the one or more shared package pins are coupled to at least one of testing logic and debug logic on the die.

6. A semiconductor package comprising:
two or more dies coupled to a one or more shared package pins, each die of the two or more dies including:
an output enable register; and
logic configured to:
drive a die identifier to arbitration circuitry based on determining that a value in the output enable register indicates that access to one or more shared package pins is granted to the die, wherein each bit of the die identifier is driven serially;

and
assert, by the die, control over the one or more shared package pins in response to determining that the die has won arbitration based on each result bit broadcast by the arbitration circuitry in response to each bit of the die identifier.

7. The semiconductor package of claim 6, wherein asserting control over the one or more shared package pins includes:
driving an output of the die to the one or more shared package pins.

8. The semiconductor package of claim 7 wherein the identifier of the die is driven in response to at least one of:
identifying that the value has transitioned from an inactive state value to an active state value; and
identifying a start bit broadcast by the arbitration circuitry.

9. The semiconductor package of claim 7, wherein the logic is further configured to:
determine, when a result bit broadcast by the arbitration circuitry indicates that the die lost arbitration, that control over the one or more shared package pins cannot be asserted by the die.

10. The semiconductor package of claim 9, wherein the logic is further configured to:
update, in response to determining that the die lost arbitration, the value in the output enable register.

11. The semiconductor package of claim 7, wherein the arbitration circuitry includes at least one of an open-drain circuit and an open-collector circuit.

12. The semiconductor package of claim 6, wherein the one or more shared package pins are designed-for-test pins.

13. A method comprising:
storing a first value in a first output enable register of a first die;
driving a first die identifier of the first die to arbitration circuitry based on determining that the first value indicates that access to one or more shared package pins is granted to the first die, wherein each bit of the first die identifier is driven serially;
and
asserting, by the first die, control over the one or more shared package pins in response to determining that the first die has won arbitration based on each result bit broadcast by the arbitration circuitry in response to each bit of the first die identifier.

14. The method of claim 13, wherein the first die is disposed in a semiconductor package; and wherein the die shares access to the one or more shared package pins with two or more other dies in the semiconductor package.

15. The method of claim 13, wherein asserting control over the one or more shared package pins includes:
driving an output of the first die to the one or more shared package pins.

16. The method of claim 15, wherein the first die identifier of the first die is driven in response to at least one of:
identifying that the first value has transitioned from an inactive state value to an active state value; and
identifying a start bit broadcast by the arbitration circuitry.

17. The method of claim 15 further comprising:
storing a second value in a second output enable register of a second die;
driving a second die identifier of the second die to the arbitration circuitry based on determining the second value indicates that access to one or more shared package pins is granted to the second die, wherein each bit of the second die identifier is driven serially; and
determining, when a result bit broadcast by the arbitration circuitry in response to each bit of the second die identifier indicates that the second die lost arbitration, that control over the one or more shared package pins cannot be asserted by the second die.

18. The method of claim 17 further comprising:
updating, in response to determining that the second die lost arbitration, the second value in the second output enable register.

19. The method of claim 15, wherein the arbitration circuitry includes at least one of an open-drain circuit and an open-collector circuit.

20. The semiconductor die of claim 1, wherein each result bit is broadcast by the arbitration circuitry to each die participating in arbitration over a common pathway.

* * * * *